United States Patent
Kim et al.

(10) Patent No.: US 8,200,607 B2
(45) Date of Patent: Jun. 12, 2012

(54) MEMORY DEVICES AND DATA DECISION METHODS

(75) Inventors: Jae Hong Kim, Seoul (KR); Heeseok Eun, Yongin-si (KR); Yong June Kim, Seoul (KR); Jun Jin Kong, Yongin-si (KR); Seung-Hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 813 days.

(21) Appl. No.: 12/292,539

(22) Filed: Nov. 20, 2008

(65) Prior Publication Data

US 2009/0234792 A1 Sep. 17, 2009

(30) Foreign Application Priority Data

Mar. 17, 2008 (KR) .................. 10-2008-0024415

(51) Int. Cl.
*G06F 17/00* (2006.01)
*G06N 5/02* (2006.01)
(52) U.S. Cl. .......................................... 706/50
(58) Field of Classification Search .............. 706/50
See application file for complete search history.

(56) References Cited

U.S. PATENT DOCUMENTS

| 5,467,315 A | 11/1995 | Kajimoto et al. |
| 6,185,716 B1 | 2/2001 | Riggle |
| 7,064,571 B2 | 6/2006 | Namekawa |
| 7,158,421 B2 | 1/2007 | Li et al. |
| 7,761,204 B2 * | 7/2010 | Konig .............. 701/36 |
| 2005/0010840 A1 | 1/2005 | Dorney et al. |
| 2005/0086574 A1 | 4/2005 | Fackenthal |
| 2005/0171664 A1 * | 8/2005 | Konig .............. 701/36 |

FOREIGN PATENT DOCUMENTS

| JP | 2006-048783 | 2/2006 |
| KR | 10-2005-0007653 | 1/2005 |
| KR | 10-2006-0040064 | 5/2006 |
| KR | 10-0766042 | 10/2007 |

OTHER PUBLICATIONS

PCT International Search Report and Written Opinion of the International Searching Authority mailed Mar. 20, 2009.

* cited by examiner

*Primary Examiner* — Michael B Holmes

(74) *Attorney, Agent, or Firm* — Harness, Dickey & Pierce, P.L.C.

(57) ABSTRACT

Disclosed are a memory device and a data decision method. The memory device may include a memory cell array, and a decision unit configured to read first data from the memory cell array via a first channel, perform at least one of a hard and soft decision on the first data using a first number of decision levels set based on characteristics of the first channel, read second data from the memory cell array via a second channel, and perform a soft decision on the second data using a second number of decision levels set based on characteristics of the second channel.

20 Claims, 12 Drawing Sheets

MEMORY DEVICES AND DATA DECISION METHODS

PRIORITY STATEMENT

This application claims priority under 35 U.S.C. §119 to Korean Patent Application No. 10-2008-0024415, filed on Mar. 17, 2008, in the Korean Intellectual Property Office (KIPO), the entire contents of which are incorporated herein by reference.

BACKGROUND

1. Field

Example embodiments relate to a method for deciding data received from a channel, for example, to a data decision method for a memory device.

2. Description of the Related Art

In general, a path used for transmitting data may be referred to as a channel. When data is transmitted using a wired communication, the channel may be a transmission line via which data is transmitted, and when the data is transmitted using a wireless communication, the channel may be the air through which an electromagnetic wave including information passes.

A process for storing data by a semiconductor memory device and reading the stored data from the semiconductor memory device may be the channel. The channel may be a time lag from a time point when the data is stored by the semiconductor memory device until the stored data is read from the semiconductor memory device, or a physical path via which data stored by the semiconductor memory device is read from the semiconductor memory device.

The data may be corrupted while being transmitted via the channel. The corrupted data may include errors. Thus, methods and apparatuses for restoring original data by detecting the errors from the corrupted data and eliminating the detected errors have been developed.

A process in which transmission data is generated by applying Error Control Codes or Error Correction codes (ECC) to original data before transmitting the data may denote ECC encoding, and a process in which the transmission data is received and the applied data and the original data is divided from the received transmission data to thereby restore the original data may denote ECC decoding.

According to characteristics of the channel, a percentage of errors that occur in the channel may be large. A complexity of hardware for implementing ECC encoding/decoding methods for realizing desired performance by overcoming these errors may increase along with an increase in the percentage of occurrence of the errors.

SUMMARY

Example embodiments may provide a memory device and data decision method, which may apply a data decision scheme to a memory device, thereby enhancing an error correction probability when reading data of the memory device.

Example embodiments may provide a memory device and data decision method, which may apply an Error Control Codes or Error Correction Codes (ECC) scheme to a Multi-Level Cell (MLC) memory device or a Multi-Bit Cell (MBC) memory device, thereby reducing a percentage of error occurrences of a critical data page.

Example embodiments may provide a memory device and data decision method, which may reduce complexity of hardware of an ECC decoder applied to a MLC or MBC memory device.

According to example embodiments, there may be provided a memory device including a memory cell array and a decision unit. The decision unit may read first data from the memory cell array via a first channel and perform at least one of a hard and soft decision on the first data using a first number of decision levels set based on characteristics of the first channel. Also, the decision unit may read second data from the memory cell array via a second channel, and perform a soft decision on the second data using a second number of decision levels set based on characteristics of the second channel.

According to example embodiments, there may be provided a data decision method, including receiving first data via a first channel, performing at least one of a hard and soft decision on the first data using a first number of decision levels set based on characteristics of the first channel, receiving second data via a second channel, and performing a soft decision the second data using a second number of decision levels set based on characteristics of the second channel.

BRIEF DESCRIPTION OF THE DRAWINGS

Example embodiments will become apparent and more readily appreciated from the following detailed description of example embodiments, taken in conjunction with the accompanying drawings of which.

DETAILED DESCRIPTION OF EXAMPLE EMBODIMENTS

Figure 1:
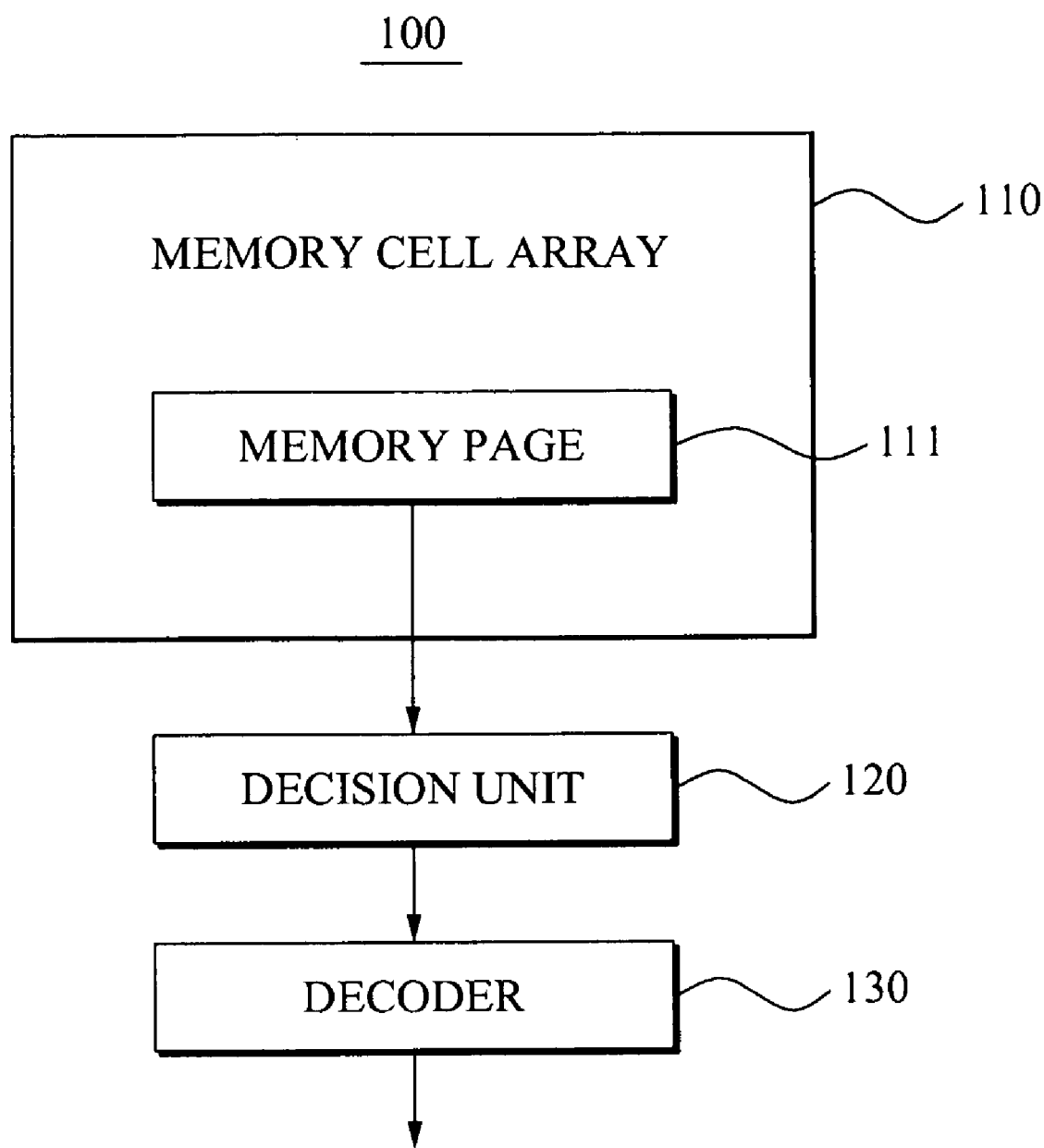
FIG. 1 is a diagram illustrating a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to example embodiments illustrated in the accompanying drawings, wherein like reference numerals refer to the like elements throughout. Example embodiments are described below in reference to the figures. In some instances, well-known features may be omitted to prevent cumbersome descriptions of example embodiments.

FIG. 1 is a diagram illustrating a memory device 100 according to example embodiments.

Referring to FIG. 1, the memory device 100 according to example embodiments includes a memory cell array 110, a decision unit 120, and a decoder 130.

The memory cell array 110 may include a memory page 111, and the memory page may include a plurality of memory cells. The decision unit 120 may simultaneously read data from the plurality of memory cells of the memory page 111.

According to example embodiments, the memory page 111 may be a collection of memory cells connected with a single word line. The memory device 100 may simultaneously read data from the plurality of memory cells within the memory page 111 by applying a specific voltage to a word line connected with the memory page 111. The collection of memory cells connected with the single word line may designate a memory page.

The decision unit 120 may read first data from the memory page 111 via a first channel, and perform a hard or soft decision on the first data using a first number of decision levels set based on characteristics of the first channel. The first channel may be a path through which the first data is read from the memory page 111. The decision unit 120 may read the first data using a number of read levels being associated with the first number.

The decision unit 120 may read second data from the memory page 111 via a second channel, and perform a soft decision on the second data using a second number of decision levels set based on characteristics of the second channel. The second channel may be a path through which the second data is read from the memory page 111. The decision unit 120 may read the second data using a number of read levels being associated with the second number.

The decoder 130 may perform Error Control Codes, Error Control Coding or Error Correcting Codes (ECC) decoding on the first data on which the hard decision or soft decision is performed, and also perform ECC decoding on the second data on which a soft decision is performed.

A Single-Level Cell (SLC) memory may be a memory where one-bit data is stored in a single memory cell. The SLC memory may be referred to as a Single-Bit Cell (SBC) memory. A process for storing one-bit data in an SLC of the SLC memory may be referred to as a programming process. The SLC memory may have either a relatively higher threshold voltage level or a relatively lower threshold voltage level depending on whether the one-bit data stored in the SLC is either '0' or '1'. A process for reading data stored in the SLC may be performed such that a threshold voltage of the SLC is sensed and whether the sensed threshold voltage is higher than a reference voltage (or read voltage) level is decided.

When the memory device 100 applies a specific voltage associated with a read voltage level to the word line connected with the memory cells of the memory page 111, a current flowing in each of bit lines connected with each of the memory cells may be determined depending on whether the threshold voltage level of each of the memory cells of the memory page 111 is higher than the read voltage level. The decision unit 120 may sense the current flowing in each of the bit lines connected with each of the memory cells of the memory page 111, and decide a range of the threshold voltage level of the memory cells of the memory page 111 according to a level of the sensed current.

The threshold voltage of each of the SLCs may have a distribution with a range due to slight differences in electric characteristics of each of the SLCs. For example, when a threshold voltage of a sensed SBC is 0.5 to 1.5 volts, data stored in the SBC may be decided to be a logic '1', and when the threshold voltage is 2.5 to 3.5 volts, the data may be decided to be a logic '0'.

A Multi-Level Cell (MLC) memory for storing at least two-bit data in a single memory cell in response to a request for high integration of a memory has been suggested. The MLC memory may be referred to as a Multi-Bit Cell (MBC) memory. As a number of bits stored in a single memory cell increases, reliability may deteriorate and a read failure rate may increase. When m-bit data is stored in a single memory cell, where 'm' is a natural number, a threshold voltage level generated in the single memory cell may be any one of $2^m$ threshold voltage levels. When each of the memory cells stores the m-bit data, the threshold voltage levels of the memory cells may generate $2^m$ distributions.

Since a voltage window of a memory may be restricted, an interval between adjacent distributions may be reduced along with an increase in 'm'. Further, along with a significant increase in 'm', the adjacent distributions may be overlapped with each other. When the adjacent distributions are overlapped with each other, a read failure rate of data read from the memory cells may further increase.

The ECC encoding and/or ECC decoding scheme may be applicable to the MLC memory, so that data is stored in the MLC memory, where errors occurring when reading data from the MLC memory may be detected and corrected.

The decision unit 120 may identify a distribution of a threshold voltage using a single read voltage level or a plurality of read voltage levels while data is being read from the memory cell array 110. In this instance, a scheme for reading data using the single read voltage level and deciding the read data may be referred to as a hard decision scheme, and a scheme for reading data using the plurality of read voltage levels and deciding the read data may be referred to as a soft decision scheme.

The hard decision scheme may assign a value of '1' or '0' depending on whether a threshold voltage of the corresponding memory cell is higher or lower than a single read voltage level.

The soft decision scheme may decide an interval where the threshold voltage of the corresponding memory cell is positioned by comparing the threshold voltage of the corresponding memory cell with the plurality of read voltage levels, and assign a metric value to the determined interval.

The assigned metric value may be a Likelihood Ratio (LR) or Log Likelihood Ratio (LLR).

Figure 2:
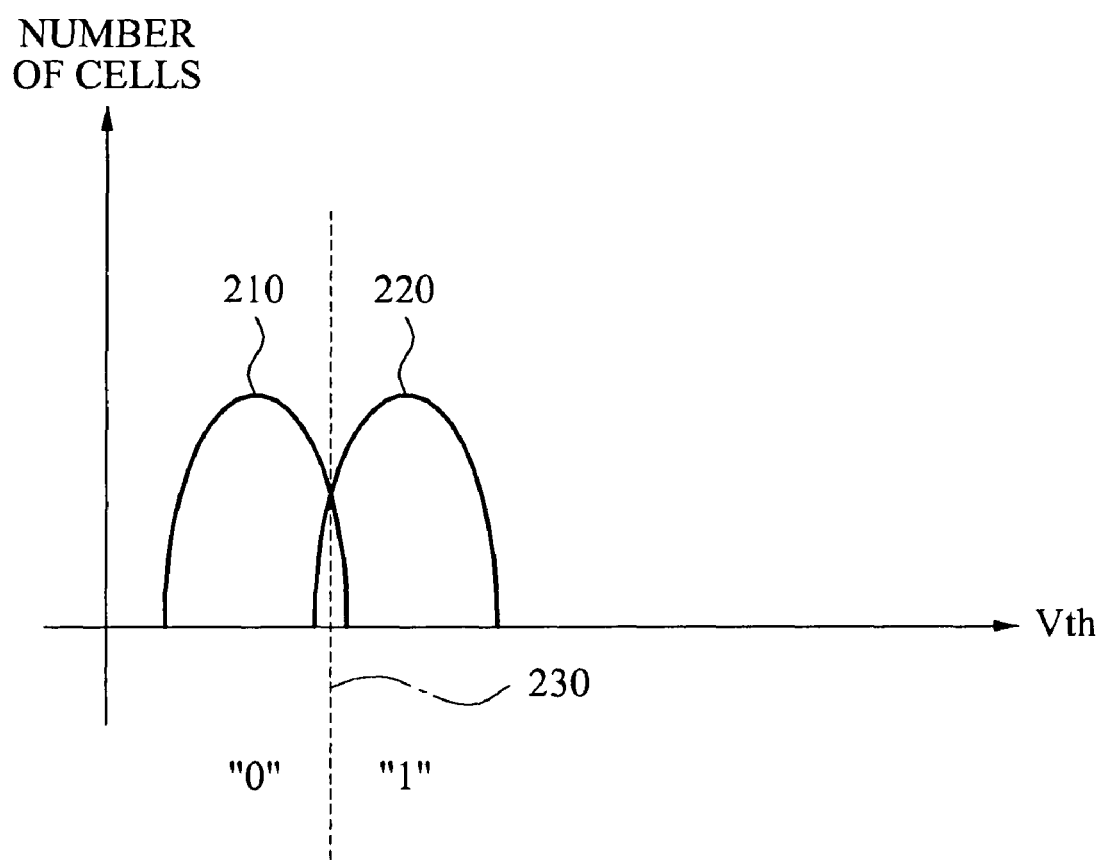
FIG. 2 is a diagram illustrating a process in which a memory device according to example embodiments reads data from memory cells and performs a hard decision on the read data.
Figure 3:
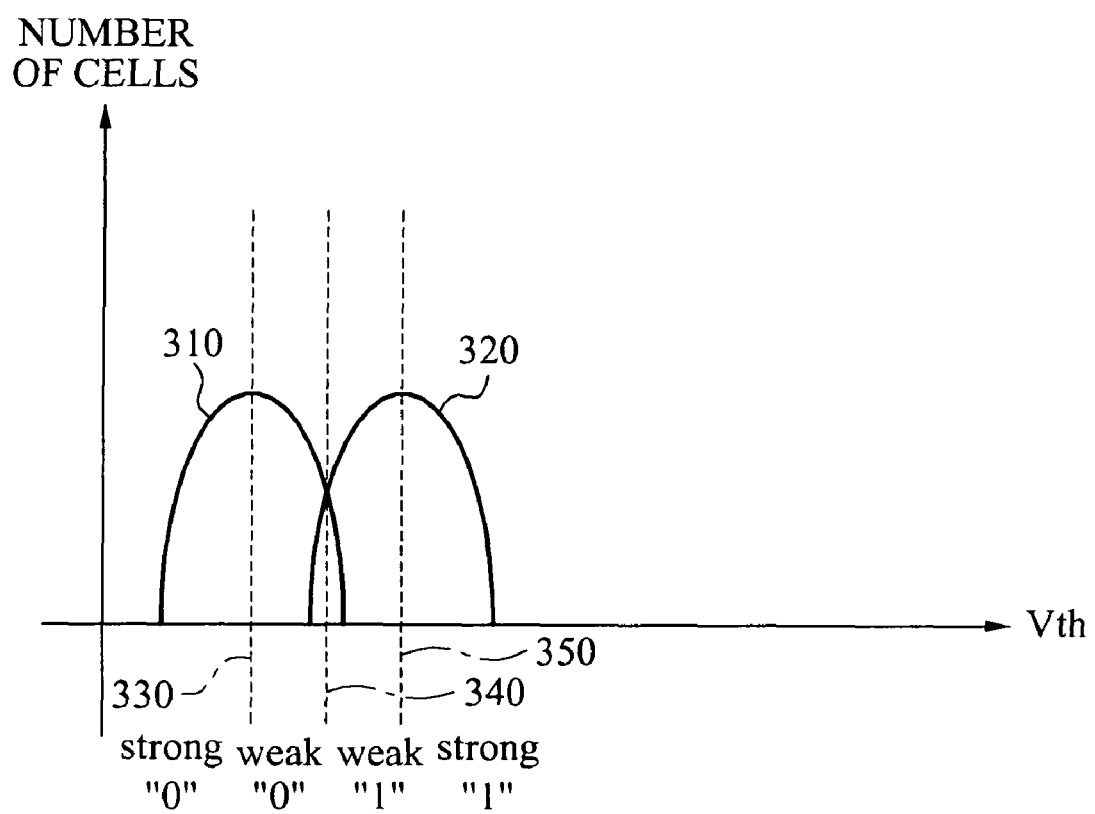
FIG. 3 is a diagram illustrating a process in which a memory device according to example embodiments reads data from memory cells and performs a soft decision on the read data.

Examples of the hard and soft decision schemes are illustrated in FIGS. 2 and 3.

FIG. 2 is a diagram illustrating a process in which a memory device according to example embodiments reads data from memory cells and performs a hard decision on the read data.

Referring to FIG. 2, an abscissa axis denotes a threshold voltage level of memory cells, and an ordinate axis denotes a number of memory cells having the corresponding threshold voltage level.

A first distribution 210 is a distribution generated by threshold voltages of memory cells where data of value '0' is stored. A second distribution 220 is a distribution generated by threshold voltages of memory cells where data of value '1' is stored.

As described above, since electric characteristics of the memory cells may be different with respect to each other, threshold voltages of memory cells where specific data is stored may have a distribution of a range.

When a difference between the threshold voltages of the memory cells where '1' is stored and the threshold voltages of the memory cells where '0' is stored is relatively less, the first and second distributions 210 and 220 may be overlapped with each other.

The memory device may set a read voltage level 230, and sense a threshold voltage of memory cells using the set read voltage level 230 to thereby read data.

The memory device may apply a predetermined voltage to a gate terminal of each of the memory cells, and sense a current between drain and source terminals of each of the memory cells to thereby sense detect the threshold voltage of each of the memory cells. The predetermined voltage applied to the gate terminal of each of the memory cells may be related with the read voltage level, and a gate terminal of each of the memory cells forming a row within a memory cell array may be connected with a single word line. The memory device may apply the predetermined voltage to the word line to thereby sense a threshold voltage of the memory cells connected with the word line.

The memory device may decide whether the threshold voltage of each of the memory cells is higher than the read voltage level 230. The memory device may decide data of memory cells having a threshold voltage less than the read voltage level 230 as '0'. In addition, the memory device may decide data of memory cells having a threshold voltage greater than the read voltage level 230 as '1'.

In a hard decision process, data of the memory cells may be decided to be '1' or '0'. As illustrated in FIG. 2, in the case where the first and second distributions 210 and 220 are overlapped with each other, when a threshold voltage of a memory cell (where '1' is stored) corresponding to the second distribution 220 is decided to be less than the read voltage level 230, data of the memory cell corresponding to the second distribution 220 may be erroneously decided to be '0'. Conversely, when a threshold voltage of a memory cell (where '0' is stored) corresponding to the first distribution 210 is decided to be greater than the read voltage level 230, data of the memory cell corresponding to the first distribution 210 may be erroneously decided to be '1'.

When the data stored in the memory cell is erroneously decided in the hard decision process, the memory device may determine that the data on which the hard decision is performed has errors, and indicate a ratio of the data having errors from among all of the data simultaneously, which may be referred to as a Bit Error Rate (BER).

Unlike the hard decision, the soft decision scheme may be indicated as a probability that a decision result is '0' or '1'.

FIG. 3 is a diagram illustrating a process in which a memory device according to example embodiments reads data from memory cells and performs a soft decision on the read data.

Referring to FIG. 3, an abscissa axis denotes a threshold voltage level of memory cells, and an ordinate axis denotes a number of memory cells having the corresponding threshold voltage level.

A first distribution 310 is a distribution generated by threshold voltages of memory cells where data of value '0' is stored. A second distribution 320 is a distribution generated by threshold voltages of memory cells where data of value '1' is stored.

When a difference between the threshold voltages of the memory cells where '1' is stored and the threshold voltages of the memory cells where '0' is stored is relatively less, the first and second distributions 310 and 320 may be overlapped with each other.

The memory device may set first, second, and third read voltage levels 330, 340, and 350, and sense a threshold voltage of memory cells using the set read voltage levels 330, 340, and 350 to thereby read data.

For example, the memory device may apply a voltage associated with the first read voltage level 330 to a gate terminal of each of the memory cells, and sense whether a threshold voltage of each of the memory cells is higher than the first read voltage level 330. For the convenience of descriptions, when a threshold voltage of a specific memory cell is higher than the first read voltage level 330, the threshold voltage may be indicated as 'H', and when the threshold voltage is lower than the first read voltage level 330, the threshold voltage may be indicated as 'L'.

The memory device may apply a voltage associated with the second read voltage level 340 to the gate terminal of each of the memory cells, and sense whether the threshold voltage of each of the memory cells is higher than the second read voltage level 340. When, the threshold voltage of the specific memory cell is higher than the second read voltage level 340, the threshold voltage may be indicated as 'H', and when the threshold voltage is lower than the second read voltage level 340, the threshold voltage may be indicated as 'L'.

The memory device may apply a voltage associated with the third read voltage level 350 to the gate terminal of each of the memory cells, and sense whether the threshold voltage of each of the memory cells is higher than the third read voltage level 350. When, the threshold voltage of the specific memory cell is higher than the third read voltage level 350, the threshold voltage may be indicated as 'H', and when the threshold voltage is lower than the third read voltage level 350, the threshold voltage may be indicated as 'L'.

For example, when compared results between the threshold voltage of the specific memory cell with the first, second, and third read voltage level 330, 340, and 350, respectively may be indicated as (H, L, L) in that named order, the memory device may determine that the threshold voltage of the specific memory cell is positioned in an interval between the read voltage levels 330 and 340.

A memory cell having the threshold voltage within the interval between the read voltage levels 330 and 340 may have a higher probability of being a memory cell where data of value '0' is stored. However, there remains a lower probability that memory cell is storing data of value '0' instead.

For example, when the compared results are indicated as (L, L, L) in that named order, the memory device may determine the threshold voltage of the specific memory cell to be positioned in an interval where the threshold voltage is less than the read voltage level 330. The memory cell having the threshold voltage within the interval less than the read voltage level 330 may have a significant higher probability of being the memory cell where '0' is stored, and have a significant lower probability of being the memory cell where '1' is stored.

Thus, the memory device may assign strong '0' to a memory cell having a threshold voltage within an interval less than the read voltage level 330, and assign weak '0' to a memory cell having a threshold voltage within an interval between the read voltage levels 330 and 340. The memory device may assign, to four intervals partitioned by the three read voltage levels 330, 340, and 350, an LLR value which indicates a probability that data is '0' or '1' as a log scale, respectively. For example, a '−100' LLR value of a probability that data is '1' may be assigned to an interval less than the read voltage level 330, a '−1' LLR value may be assigned to an interval between the read voltage levels 330 and 340, a '+1' LLR value may bee assigned to an interval between the read voltage levels 340 and 350, and a '+100' LLR value may be assigned to an interval higher than the read voltage level 350.

When the threshold voltage of the specific memory cell is determined to be position in the interval between the read voltage levels 340 and 350, the memory device may assign '+1' of the LLR value to data of the specific memory cell, thereby performing a soft decision on the data of the specific memory cell.

The memory cell may output (k+1) values different from each other as soft decision data when sensing a threshold voltage of a memory cell using k-read voltage levels. In this instance, the memory device may perform a soft decision of (k+1) decision levels on the data.

A hard decision may be regarded as a specific type of a soft decision where a decision level is '2'. As the decision level of the soft decision increases, decision errors of data may be reduced; however, complexity of hardware for implementing the soft decision process may be increase. As a number of read voltage levels increase, a time required for sensing the threshold voltage of the memory cells may increase as well.

According to characteristics of a memory channel, a significant increase in the decision level may not further reduce the BER. The memory device may set a number of decision levels optimized according to the characteristics of the memory channel.

The memory device may determine a read voltage level corresponding to the number of decision levels and the decision level according to the characteristics of the memory channel.

Referring again to FIG. 1, the memory cell array 110 may include the plurality of multi-bit cells where multi-bit data is stored. The decision unit 120 may read the second data from the multi-bit cells where the first data is read.

The first and second data may be data stored in the multi-bit cells of the memory page 111. The first and second data may be data stored in identical multi-bit cells; however, the data may form bit layers different from each other. For example, the decision unit 120 may read, from the multi-bit cells of the memory page 111, with the first data forming a bit layer of a Most Significant Bit (MSB) and the second data forming a bit layer of a Least Significant Bit (LSB).

Alternatively, when the multi-bit cells store four-bit data, four bit layers may exist. When the bit layer of the MSB designates a first bit layer and the bit layer of the LSB designates a fourth bit layer, the decision unit 120 may read data forming the first bit layer as first data, read data forming the second bit layer as second data, read data forming the third bit layer as third data, and read data forming the fourth bit layer as fourth data. The first channel may be a path through which the decision unit 120 reads, from the multi-bit cells of the memory page 111, the first data forming the first bit layer, and the second channel may be a path through which the decision unit 120 reads, from the multi-bit cells of the memory page 111, the second data forming the second bit layer.

A first number of decision levels used for determining the read first data by the decision unit 120 may be set based on characteristics of the first channel, and a second number of decision levels used for determining the read second data by the decision unit 120 may be set based on characteristics of the second channel.

According to example embodiments, the decision unit 120 may read the data forming the first bit layer as the first data, data forming the second bit layer as the second data, data forming a third bit layer as third data, and data forming a fourth bit layer as fourth data.

According to example embodiments, the decision unit 120 may set a first number of decision levels for determining the read first and second data, and also set a second number of decision levels for determining the read third and fourth data. According to example embodiments, the decision unit 120 may select the first number of decision levels for determining the read first data, select the second number of decision levels for determining the read second data, select a third number of decision levels for determining the read third data, and select a fourth number of decision levels for determining the read fourth data.

The data forming bit layers may designate data forming pages. According to example embodiments, a gathering or collection of the multi-bit cells connected with a single word line may be designated as a memory page, and data stored in multi-bit cells of a single memory page and forming a single bit layer may be designated as a data page. These designations are merely used for the convenience of descriptions, and thus example embodiments are not limited to these designations.

According to example embodiments, a bit layer corresponding to the MSB may experience a transition with respect to change in a threshold voltage of multi-bit cells. The transition may be an event in which a value of data of a bit layer is changed either from '1' to '0' or from '0' to '1' according to the change in the threshold voltage. When a hard decision scheme is applied to a bit layer corresponding to the MSB, it may be determined that '1' is stored in multi-bit cells having a threshold voltage less than a single read voltage level, and '0' is stored in multi-bit cells having a threshold voltage higher than the read voltage level. When a soft decision scheme is applied to the bit layer corresponding to the MSB, it may be determined that the MSB of the multi-level cells is an LLR value using 'k' read voltage levels, where k is a natural number. The bit layer corresponding to the LSB may experience 'm' transitions with respect to the change in the threshold voltage of the multi-bit cells. When the hard decision scheme is applied to the bit layer corresponding to the LSB, the m transitions may be detected using m-read voltage levels. When a soft decision scheme using k-read voltage levels for each transition is applied to the bit layer corresponding to the LSB, the LSB may be determined as the LLR value using (k×m) number of read voltage levels.

According to example embodiments, the memory page 111 may be a single memory page, and the first data may be a first data page forming the bit layer of the MSB. The second data may be a second data page forming the bit layer of the LSB. The first channel may be a path through which the decision unit 120 reads the first data page using the read voltage level. A certain number of read voltage levels may be set in the vicinity of a threshold voltage level having a higher probability that the bit layer experiences the transition, and the decision unit 120 may read the first data from the multi-bit cells of the memory page 111 using the set read voltage level. The certain number of read voltage levels may be related with a first number of decision levels, and the first number of decision levels with respect to the first data and the first channel may be set according to a number of times of transitions experienced by the bit layer of the MSB. Similarly, a second number of decision levels with respect to the second data and the second channel may be set according to a number of times of transitions experienced by the bit layer of the LSB. The read voltage level used in a process for reading the second data may be related with the set second number of decision levels.

A probability of occurrence of errors in a channel corresponding to a bit layer may increase along with an increase in the number of times of transitions experienced by the bit layer. Since the bit layer of the LSB may experience more transitions than in the bit layer of the MSB, a probability of occurrence of errors in the second channel may be greater than a probability of occurrence of errors in the first channel. Thus, the decision unit 120 may set a greater number of soft decision levels than a number of the first channels in the second channel estimated that relatively more errors occur.

For example, the decision unit 120 may read the first data using one read voltage level, and perform the hard decision on the read first data. The decision unit 120 may read the second data using k×m numbered read voltage levels, and perform a soft decision of (k+1) levels on the read second data. The decoder 130 may perform ECC decoding on the first data on which the hard decision is performed, and perform ECC decoding on an LLR value generated by the second data on which the soft decision is performed.

According to another example, the decision unit 120 may read the first data using k1 numbered read voltage levels, and perform a soft decision of (k1+1) level on the read first data. The decision unit 120 may read the second data using k2×m numbered (where k2>k1) read voltage levels, and perform a soft decision of (k2+1) level on the read second data.

According to example embodiments, a data decision scheme and a number of decision levels each corresponding to a channel in accordance with a bit layer of a multi-bit cell may be determined, and thereby a data decision scheme optimized to channel characteristics changed according to the bit layer of the multi-bit cell may be implemented. According to example embodiments, error correctability of a critical page having a highest probability of occurrence of errors may increase.

According to example embodiments, the memory device 100 may adjust a BER of data pages on which a soft or hard decision to be uniform, and thus transmitting data to an exterior host device or processor (not shown) regardless of the bit layer.

The external host device or processor may process data regardless of physical characteristics of the memory device 100, and access to the memory device 100 using a logical address without considering a physical address.

The decision unit 120 may determine a data decision scheme and a number of decision levels corresponding to the first and second channel depending on an overlapped ratio between distributions of the threshold voltage of the multi-bit cells. The decision unit 120 may determine an LLR value assigned to each of decision intervals partitioned by the decision level according to the overlapped ratio.

According to example embodiments, the decision unit 120 may read data forming the first bit layer as the first data, data forming the second bit layer as the second data, data forming the third bit layer as the third data, and data forming the fourth bit layer as the fourth data. The decision unit 120 may perform the soft decision on the fourth data using results obtained by performing the hard or soft decision on the first, second, and third data.

FIGS. 4 to 7 are diagrams illustrating a data determination operation of the memory device illustrated in FIG. 1, according to example embodiments.

Figure 4:
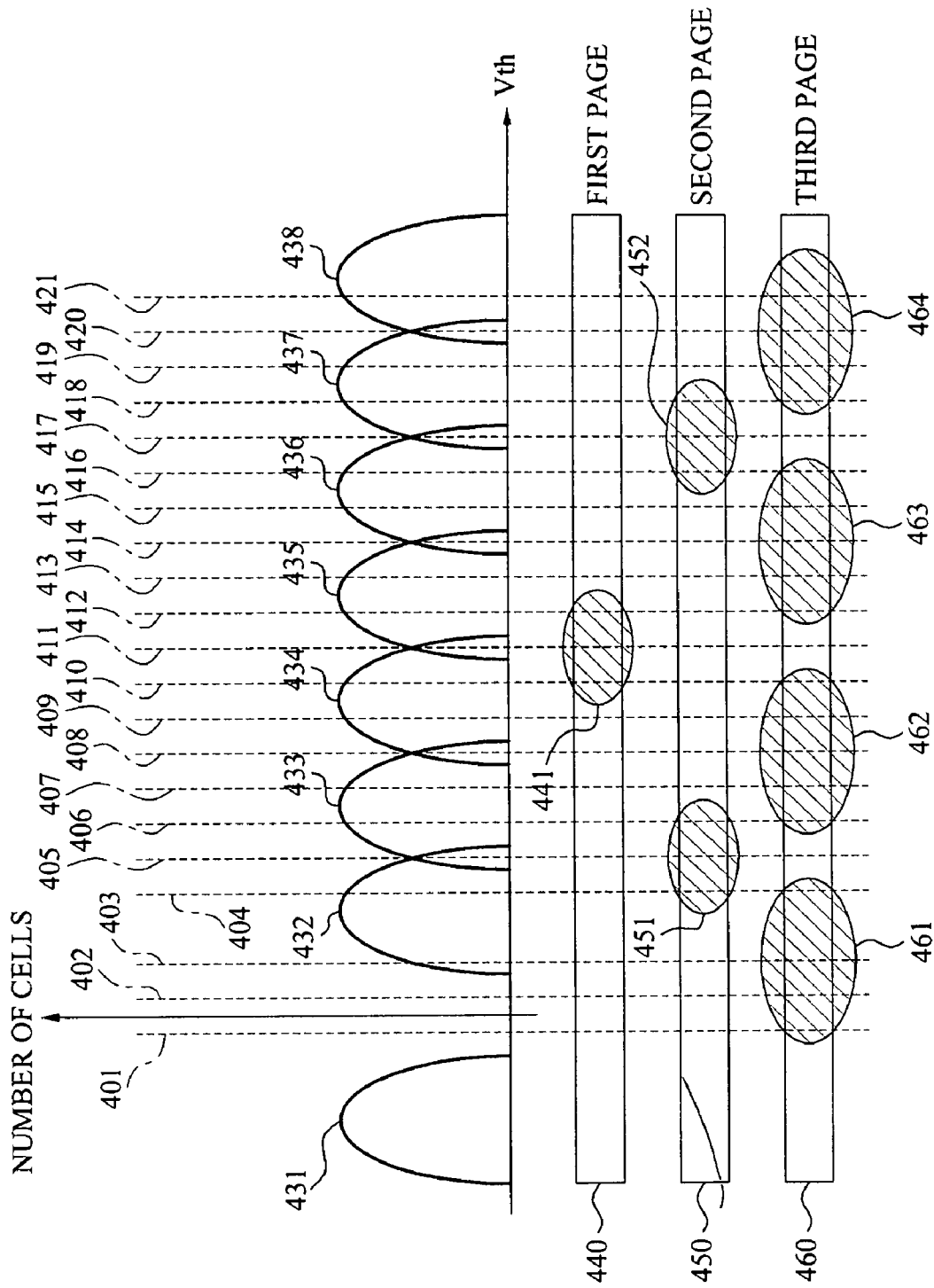
FIGS. 4 to 7 are diagrams illustrating a data decision operation of the memory device illustrated in FIG. 1, according to example embodiments.

Referring to FIG. 4, an abscissa axis denotes a threshold voltage level of memory cells of the memory cell array 110, and an ordinate axis denotes a number of memory cells having the corresponding threshold voltage level.

A first distribution 431 is a distribution generated by threshold voltages of the multi-bit cells where data of value '111' is stored. A second distribution 432 is a distribution generated by threshold voltages of the multi-bit cells where data of value '110' is stored. A third distribution 433 is a distribution generated by threshold voltages of the multi-bit cells where data of value '100' is stored. A fourth distribution 434 is a distribution generated by threshold voltages of the multi-bit cells where data of value '101' is stored.

A fifth distribution 435 is a distribution generated by threshold voltages of the multi-bit cells where data of value '001' is stored. A sixth distribution 436 is a distribution generated by threshold voltages of the multi-bit cells where data of value '000' is stored. A seventh distribution 437 is a distribution generated by threshold voltages of the multi-bit cells where data of value '010' is stored. An eighth distribution 438 is a distribution generated by threshold voltages of the multi-bit cells where data of value '011' is stored.

A first page 440 is a data page corresponding to a bit layer of a Most Significant Bit (MSB). The bit layer of the MSB experiences one transition in the vicinity of threshold voltage levels 410, 411, and 412. The decision unit 120 may read the first data from the multi-bit cells of the memory page 111 using the threshold voltage levels 410, 411, and 412. A decision interval 441 is a fourth level decision interval formed by the threshold voltage levels 410, 411, and 412.

Figure 5:
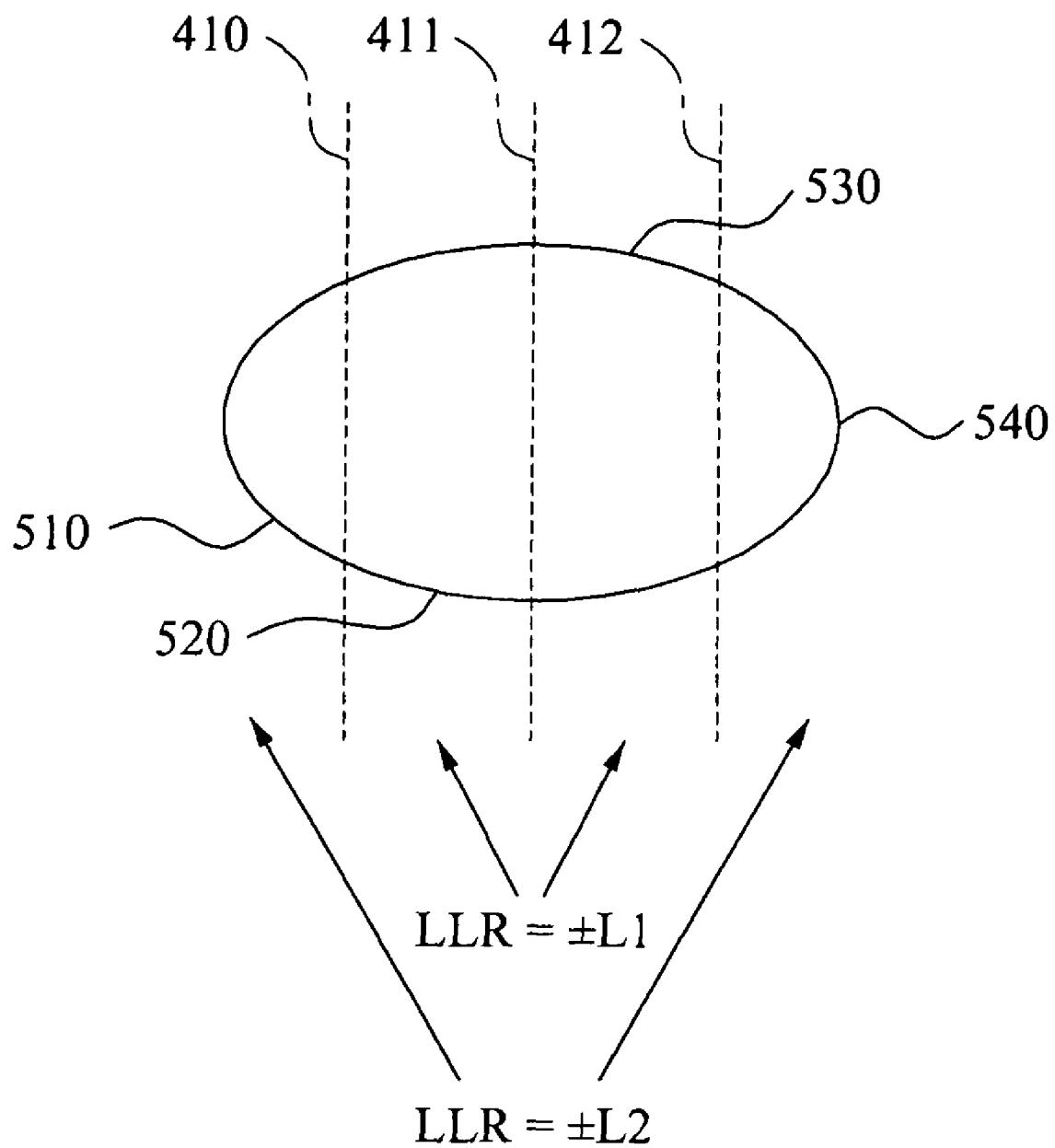

Referring to FIG. 5, the decision interval 441 includes a first decision interval 510, a second decision interval 520, a third decision interval 530, and a fourth decision interval 540.

The first decision interval 510 is a decision interval corresponding to a threshold voltage less than the threshold voltage level 410. The second decision interval 520 is a decision interval corresponding to a threshold voltage higher than the threshold voltage level 410 and less than the threshold voltage level 411. The third decision interval 530 is a decision interval corresponding to a threshold voltage higher than the threshold voltage level 411 and less than the threshold voltage level 412. The fourth decision interval 540 is a decision interval corresponding to a threshold voltage higher than the threshold voltage level 412.

The decision unit 120 may assign the LLR value to the decision intervals 510, 520, 530, and 540 according to a range of the fourth and fifth distributions 434 and 435 and an overlapped ratio between the fourth and fourth distributions 434 and 435. The decision unit 120 may assign a +L2 value to the first decision interval 510, a +L1 value to the second decision interval 520, a −L1 value to the third decision interval 530, and a −L2 value to the fourth decision interval 540. According to example embodiments, the decision unit 120 may assign the −L2 value to the first decision interval 510, the −L1 value to the second decision interval 520, the +L1 value to the third decision interval 530, and the +L2 value to the fourth decision interval 540.

A MSB of a multi-bit cell having a threshold voltage positioned in the first decision interval 510 may have a significantly higher probability of being '1' and a relatively lower probability of being '0', and thereby a magnitude of the LLR value assigned to the first decision interval 510 may be significantly greater.

A MSB of the multi-bit cell having a threshold voltage positioned in the fourth decision interval 540 may have a significantly higher probability of being '0' and a relatively lower probability of being '1', and thereby a magnitude of the LLR value assigned to the fourth decision interval 540 may be significantly greater.

An MSB of the multi-bit cell having a threshold voltage positioned in the second and third decision intervals 520 and 530 may have a significantly high probability of being '1' and a significantly high probability of being '0', and thereby the LLR value assigned to the second decision interval 520 or the third decision interval 530 may approach '0'.

Thus, the decision unit 120 may assign an L2 value, which is significantly greater than an L1 value, to the first decision interval 510 or the fourth decision interval 540.

Referring again to FIG. 4, the second page 450 is a data page corresponding to the second bit layer. The second bit layer experiences one transition in the vicinity of the threshold voltage levels 404, 405, and 406, and further experiences one transition in the vicinity of the threshold voltage levels 416, 417, and 418. The decision unit 120 may read the second data from the multi-bit cells of the memory page 111 using the threshold voltage levels 404, 405, 406, 416, 417, and 418. The decision interval 451 is a four-level decision interval formed by the threshold voltage levels 404, 405, and 406, and the decision interval 452 is a four-level decision interval formed by the threshold voltage levels 416, 417, and 418.

Figure 6:
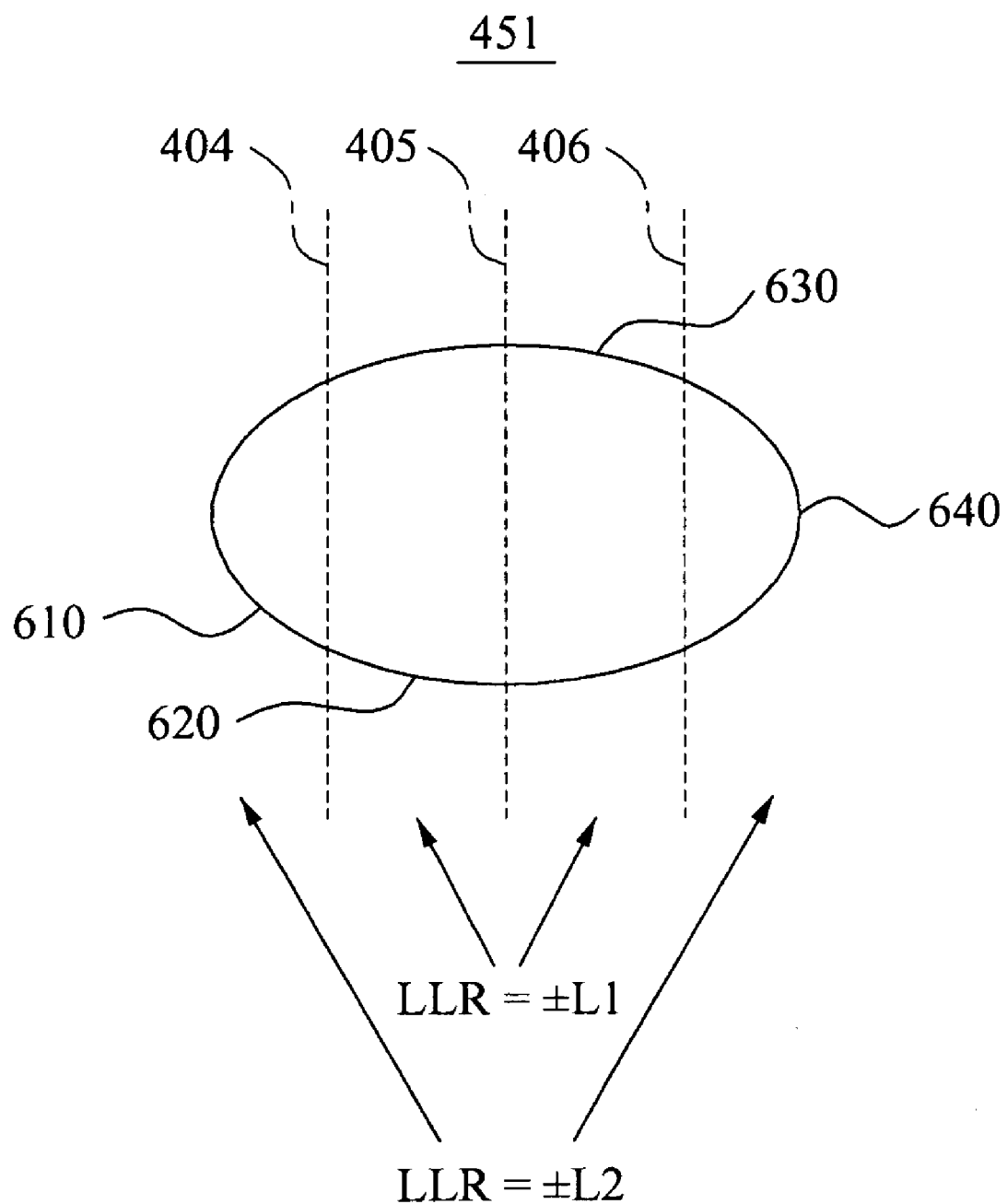

Referring to FIG. 6, the decision interval 451 includes a first decision interval 610, a second decision interval 620, a third decision interval 630, and a fourth decision interval 640.

The first decision interval 610 is a decision interval corresponding to a threshold voltage less than the threshold voltage level 404. The second decision interval 620 is a decision interval corresponding to a threshold voltage greater than the threshold voltage level 404 and less than the threshold voltage level 405. The third decision interval 630 is a decision interval corresponding to a threshold voltage greater than the threshold voltage level 405 and less than the threshold voltage level 406. The fourth decision interval 640 is a decision interval corresponding to a threshold voltage greater than the threshold voltage level 406.

The decision unit 120 may assign a LLR value to the decision intervals 610, 620, 630, and 640 according to a range of the second and third distributions 432 and 433 and an overlapped ration between the second and third distributions 432 and 433. The decision unit 120 may assign a +L2 value to the first decision interval 610, a +L1 value to the second decision interval 620, a −L1 value to the third decision interval 630, and a −L2 value to the fourth decision interval 640. Alternatively, according to example embodiments, the decision unit 120 may assign the −L2 value to the first decision interval 610, the −L1 value to the second decision interval 620, the +L1 value to the third decision interval 630, and the +L2 value to the fourth decision interval 640.

A second bit of a multi-bit cell having a threshold voltage positioned in the first decision interval 610 may have a significantly higher probability of being '1' and a relatively lower probability of being '0', and thereby a magnitude of an LLR value assigned to the first decision interval 610 may be significantly greater.

A second bit of a multi-bit cell having a threshold voltage positioned in the fourth decision interval 640 may have a significantly higher probability of being '0' and a relatively lower probability of being '1', and thereby a magnitude of the LLR value may be significantly greater.

A second bit of a multi-bit cell having a threshold voltage positioned in the second decision interval 620 or the third decision interval 630 may have a significantly high probability of being '1' and a significantly high probability of being '0', and thereby the LLR value assigned to the second decision interval 620 or the third decision interval 630 may approach '0'.

Thus, the decision unit 120 may assign an L2 value that is significantly greater than an L1 value to the first decision interval 610 or the fourth decision interval 640.

Referring again to FIG. 4, the third page 460 is a data page corresponding to a bit layer of the LSB. The bit layer of the LSB experiences a first transition in the vicinity of the threshold voltage levels 401, 402, and 403, a second transition in the vicinity of the threshold voltage levels 407, 408, and 409, a third transition in the vicinity of the threshold voltage levels 413, 414, and 415, and a fourth transition in the vicinity of the threshold voltage levels 419, 420, and 421, respectively. The decision unit 120 may read the third data from the multi-bit cells of the memory page 111 using threshold voltage levels 401, 402, 403, 407, 408, 409, 413, 414, 415, 419, 420, and 421.

The decision unit 120 may use the first and second data in a process for deciding the third data. According to example embodiments, the decision unit 120 may use results obtained by deciding the first and second data when deciding the third data. For example, the decision unit 120 may use the compared result between the threshold voltage level 404 and the threshold voltage of the multi-bit cells, which is used in a process for reading the second data, when detecting the first transition. In this instance, the decision interval 461 may be a five-level decision interval formed by the threshold voltage levels 401, 402, 403, and 404.

The decision unit 120 may use the compared result between the threshold voltage level 406 and the threshold voltage of the multi-bit cells, which is used in the process for reading the second data, when detecting the second transition. For example, the decision unit 120 may use the compared result between the threshold voltage level 410 and the threshold voltage of the multi-bit cells, which is used in a process for reading the first data, when detecting the second transition. In this instance, the decision interval 462 may be a six-level decision interval formed by the threshold voltage levels 406, 407, 408, 409, and 410.

The decision interval 463 is a six-level decision interval formed by the threshold voltage levels 412, 413, 414, 415, and 416, and the decision interval 464 is a five-level decision interval formed by the threshold voltage levels 418, 419, 420, and 421.

Figure 7:
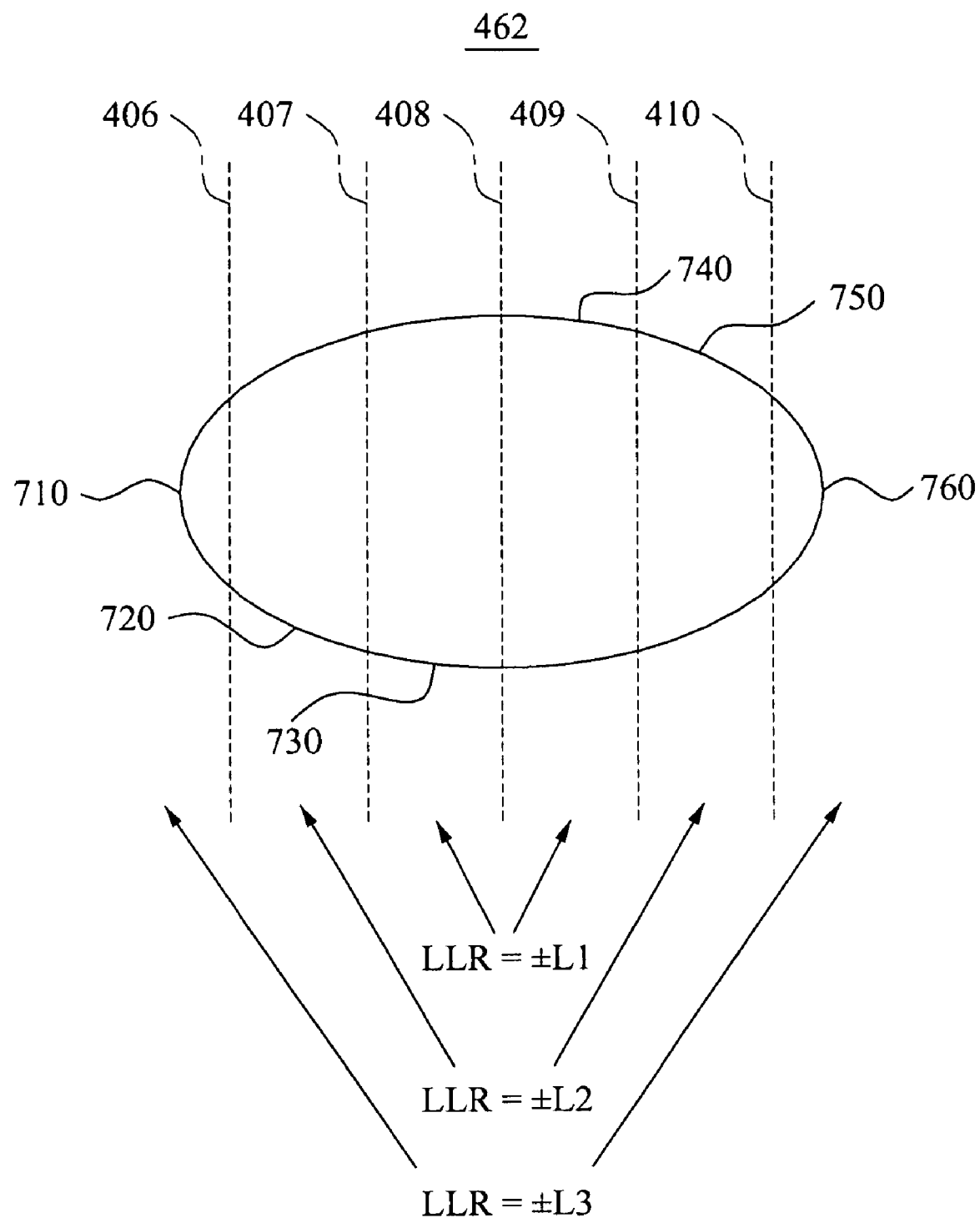

Referring to FIG. 7, the decision interval 462 includes a first decision interval 710, a second decision interval 720, a third decision interval 730, a fourth decision interval, a fifth decision interval 750, and a sixth decision interval 760.

The first decision interval 710 is a decision interval corresponding to a threshold voltage less than the threshold voltage level 406. The second decision interval 720 is a decision interval corresponding to a threshold voltage higher than the threshold voltage level 406 and less than the threshold voltage level 407. The third decision interval 730 is a decision interval corresponding to a threshold voltage higher than the threshold voltage level 407 and less than the threshold voltage level 408. The fourth decision interval 740 is a decision interval corresponding to a threshold voltage higher than the threshold voltage level 408 and less than the threshold voltage level 409. The fifth decision interval 750 is a decision interval corresponding to a threshold voltage higher than the threshold voltage level 409 and less than the threshold voltage level 410. The sixth decision interval 760 is a decision interval corresponding to a threshold voltage higher than the threshold voltage level 410.

The decision unit 120 may assign an LLR value to the decision intervals 710, 720, 730, 740, 750, and 760 according to a range of the third and fourth distributions 433 and 434 and an overlapped ratio between the third and fourth distributions 433 and 434. The decision unit 120 may assign an a +L3 value to the first decision interval 710, a +L2 value to the second decision interval 720, a +L1 value to the third decision interval 730, a −L1 value to the fourth decision interval 740, a −L2 value to the fifth decision interval 750, and a −L3 value to the sixth decision interval 760, respectively. Alternatively, according to example embodiments, the decision unit 120 may assign the −L3 value to the first decision interval 710, the −L2 value to the second decision interval 720, the −L1 value to the third decision interval 730, the +L1 value to the fourth decision interval 740, the +L2 value to the fifth decision interval 750, and the +L3 value to the sixth decision interval 760, respectively.

A LSB of a multi-bit cell having a threshold voltage positioned in the third decision interval 730 or the fourth decision interval 740 may have a significantly high probability of being '1' and a significantly high probability of being '0', and thereby an LLR value assigned to the third decision interval 730 or the fourth decision interval 740 may approach '0'.

n LSB of a multi-bit cell having a threshold voltage positioned in the second decision interval 720 may have a significantly higher probability of being '0' and a relatively lower probability of being '1', and thereby a magnitude of an LLR value assigned to the second decision interval 720 may be significantly greater.

A probability that an LSB of a multi-bit cell having a threshold voltage positioned in the first decision interval 710 is '0' may be greater than a probability that the LSB of the multi-bit cell having the threshold voltage positioned in the second decision interval 720 is '0', and thereby a magnitude (L1) of the LLR value assigned to the first decision interval 710 may be greater than a magnitude (L2) of the LLR value assigned to the second decision interval 720.

The decision unit 120 may decide data of the third page 460 using decided data or data read from the first and second pages 440 and 450, and thus applying an increased soft decision level to the third page 460 without performing an additional read operation with respect to the third page 460. Thus, the decision unit 120 may perform an effective soft decision on a critical page (where it is predicted that the largest number of errors are detected) without requiring additional read time, and reduce a BER of the critical page.

FIGS. 8 to 11 are other diagrams illustrating a data decision operation of the memory device illustrated in FIG. 1, according to example embodiments.

Figure 8:
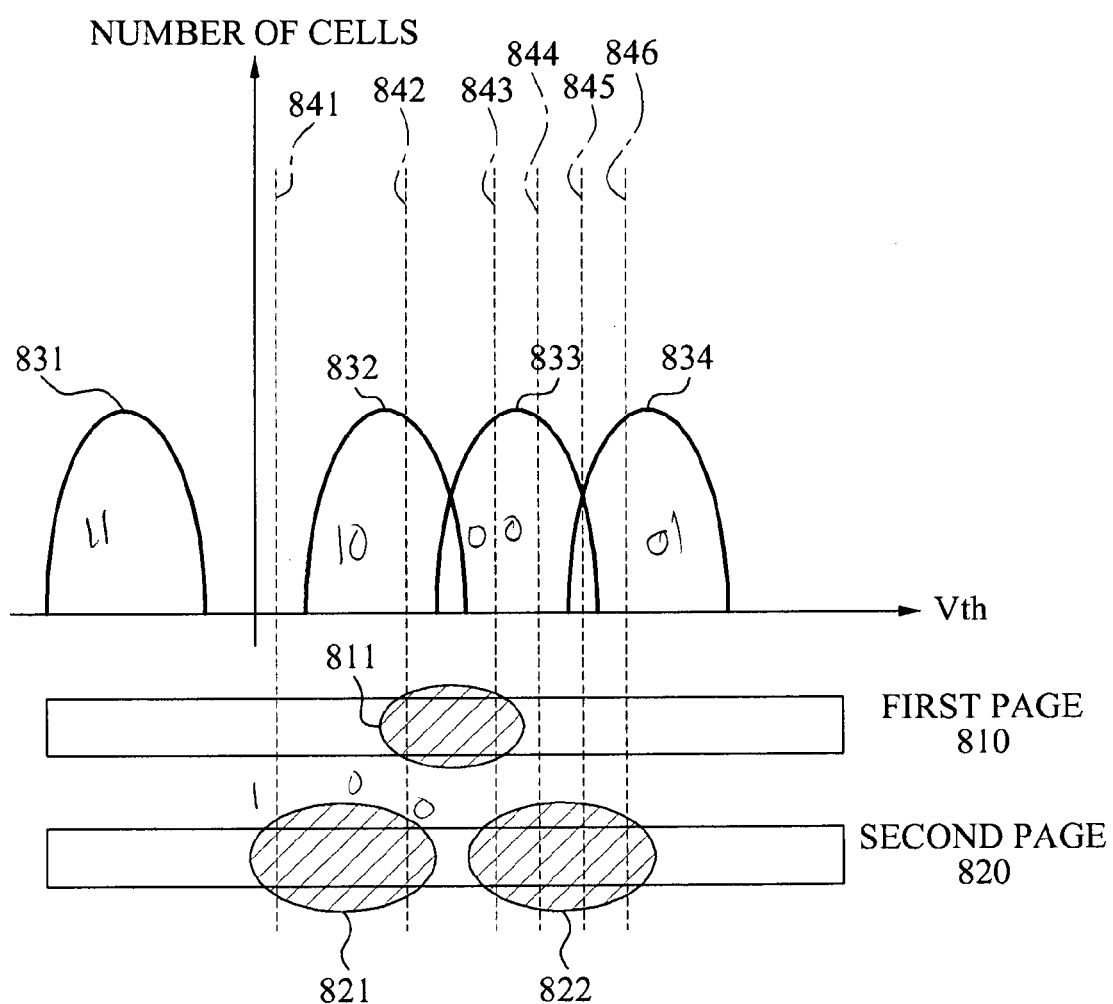
FIGS. 8 to 11 are other diagrams illustrating a data decision operation of the memory device illustrated in FIG. 1, according to example embodiments.

Referring to FIG. 8, an abscissa axis denotes a threshold voltage level of memory cells of the memory cell array 110, and an ordinate axis denotes a number of memory cells having the corresponding threshold voltage level.

A first distribution 831 is a distribution generated by threshold voltages of multi-bit cells where data of value '11' is stored. A second distribution 832 is a distribution generated by threshold voltages of multi-bit cells where data of value '10' is stored. A third distribution 833 is a distribution generated by threshold voltages of multi-bit cells where data of value '00' is stored. A fourth distribution 834 is a distribution generated by threshold voltages of multi-bit cells where data of value '01' is stored.

A first page 810 is a data page corresponding to a bit layer of an MSB. The bit layer of the MSB experiences one transition between the second and third distributions 832 and 833.

The decision unit 120 may read first data from the multi-bit cells of the memory page 111 using threshold voltage levels 842 and 843. The decision unit 120 may read the first data using the two threshold voltage levels 842 and 843 when an overlapped ratio between the second and third distributions 832 and 833 is not relatively greater.

A decision interval 811 is a three-level decision interval formed by the threshold voltage levels 842 and 843.

A second page 820 is a data page corresponding to a bit layer of an LSB. The bit layer of the LSB experiences a first transition between the first and second distributions 831 and 832, and a second transition between the third and fourth distributions 833 and 834, respectively.

The decision unit 120 may detect, from the multi-bit cells of the memory page 111, the first transition of the second page 820 using the threshold voltage level 841. The decision unit 120 may also detect, from the multi-bit cells of the memory page 111, the second transition of the second page 820.

The decision unit 120 may detect the first transition of the second page 820 using the single threshold voltage level 841 when a distance between the first and second distributions 831 and 832 is relatively greater. The decision unit 120 may detect the second transition of the second page 820 using the three threshold voltage levels 844, 845, and 846 when an overlapped ratio between the third and fourth distributions 833 and 834 is relatively greater.

The decision unit 120 may decide the second data using compared results between the threshold voltage levels 842 and 843 used in a process for reading the first data and a threshold voltage of the multi-bit cells.

A decision interval 821 is a three-level decision interval formed by the threshold voltage levels 841 and 842, and a decision interval 822 is a five-level decision interval formed by the threshold voltage levels 843, 844, 845, and 846.

Figure 9:
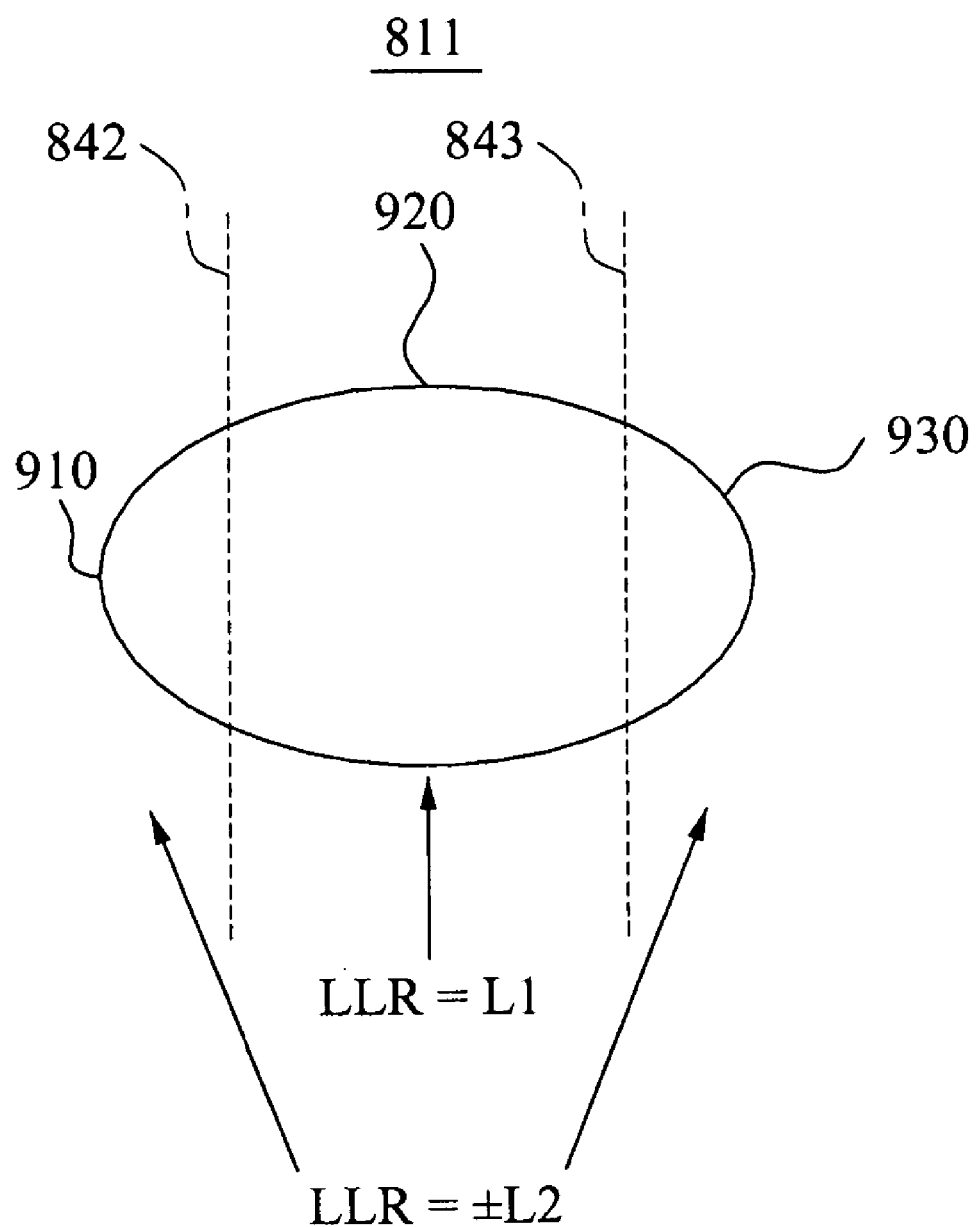

Referring to FIG. 9, the decision interval 811 includes a first decision interval 910, a second decision interval 920, and a third decision interval 930.

The first decision interval 910 is a decision interval corresponding to a threshold voltage less than the threshold voltage level 842. The second decision interval 920 is a decision interval corresponding to a threshold voltage greater than the threshold voltage level 842 and less than the threshold voltage level 843. The third decision interval 930 is a decision interval corresponding to a threshold voltage greater than the threshold voltage level 843.

The decision unit 120 may assign an LLR value to the decision intervals 910, 920, and 930, respectively, according to a range of the second and third distributions 832 and 833 and an overlapped ratio between the second and third distributions 832 and 833. The decision unit may assign a +L2 value to the first decision interval 910, a L1 value to the second decision interval 920, and a −L2 value to the third decision interval 930, respectively. Alternatively, according to example embodiments, the decision unit 120 may assign the −L2 value to the first decision interval 910, the L1 value to the second decision interval 920, and the +L2 value to the third decision interval 930, respectively.

A MSB of a multi-bit cell having a threshold voltage positioned in the first decision interval 910 may have a significantly higher probability of being '1' and a relatively lower probability of being '0', and thereby a magnitude of the LLR value (+L2 or −L2) assigned to the first decision interval 910 may be significantly greater.

A MSB of a multi-bit cell having a threshold voltage positioned in the third decision interval 930 may have a significantly higher probability of being '0' and a relatively lower probability of being '1', and thereby a magnitude of the LLR value (+L2 or −L2) assigned to the third decision interval 930 may be significantly greater.

A MSB of a multi-bit cell having a threshold voltage positioned in the second decision interval 920 may have a significantly high probability of being '1' and a significantly high probability of being '0', and thereby the LLR value (L1) assigned to the second decision interval 920 may approach '0'.

Figure 10:
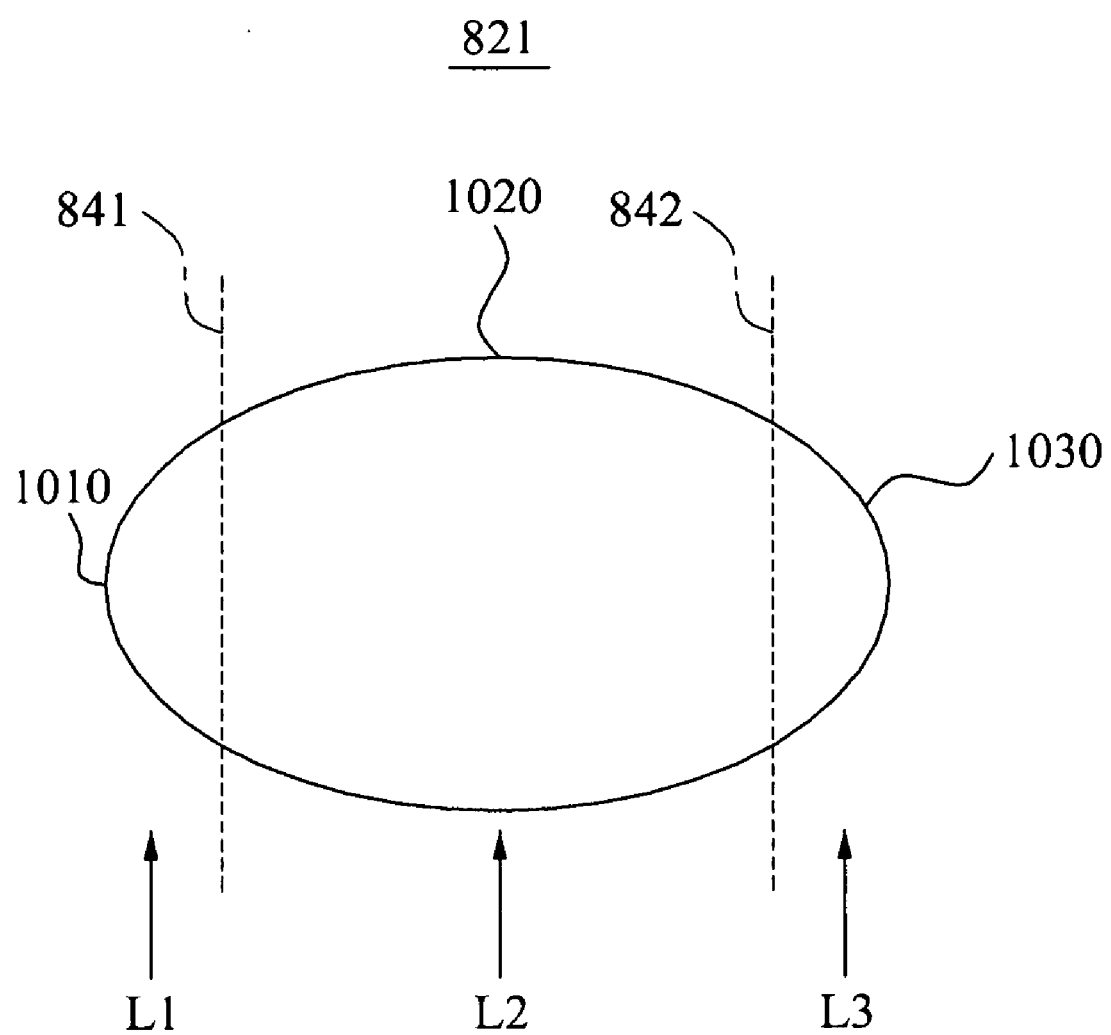

Referring to FIG. 10, the decision interval 821 includes a first decision interval 1010, a second decision interval 1020, and a third decision interval 1030.

The first decision interval 1010 is a decision interval corresponding to a threshold voltage less than the threshold voltage level 821. The second decision interval 1020 is a decision interval corresponding to a threshold voltage higher than the threshold voltage level 821 and less than the threshold voltage level 822. The third decision interval 1030 is a decision interval corresponding to a threshold voltage higher than the threshold voltage level 822.

As illustrated in FIG. 10, since a distance between the first and second distributions 831 and 832 is relatively greater, a LSB of a multi-bit cell having a threshold voltage positioned in the first decision interval 1010 may have a significantly higher probability of being '1' and a relatively lower probability of being '0'. The decision unit 120 may assign the significantly high LLR value (L1) to the first decision interval 1010.

A LSB of a multi-bit cell having a threshold voltage positioned in the second decision interval 1020 may have a significantly higher probability of being '0' and a relatively lower probability of being '1'. The decision unit 120 may assign the high LLR value (L2) to the second decision interval 1020.

A LSB of a multi-bit cell having a threshold voltage positioned in the third decision interval 1030 may have a significantly higher probability of being '0' and a significantly lower probability of being '1', and thereby the decision unit 120 may assign the LLR value (L3) higher than the L2 to the third decision interval 1020.

For example, the decision unit 120 may assign '+100' of the LLR value to the first decision interval 1010, '−50' of the LLR value to the second decision interval 1020, and '−1000' of the LLR value to the third decision interval 1030, respectively.

Figure 11:
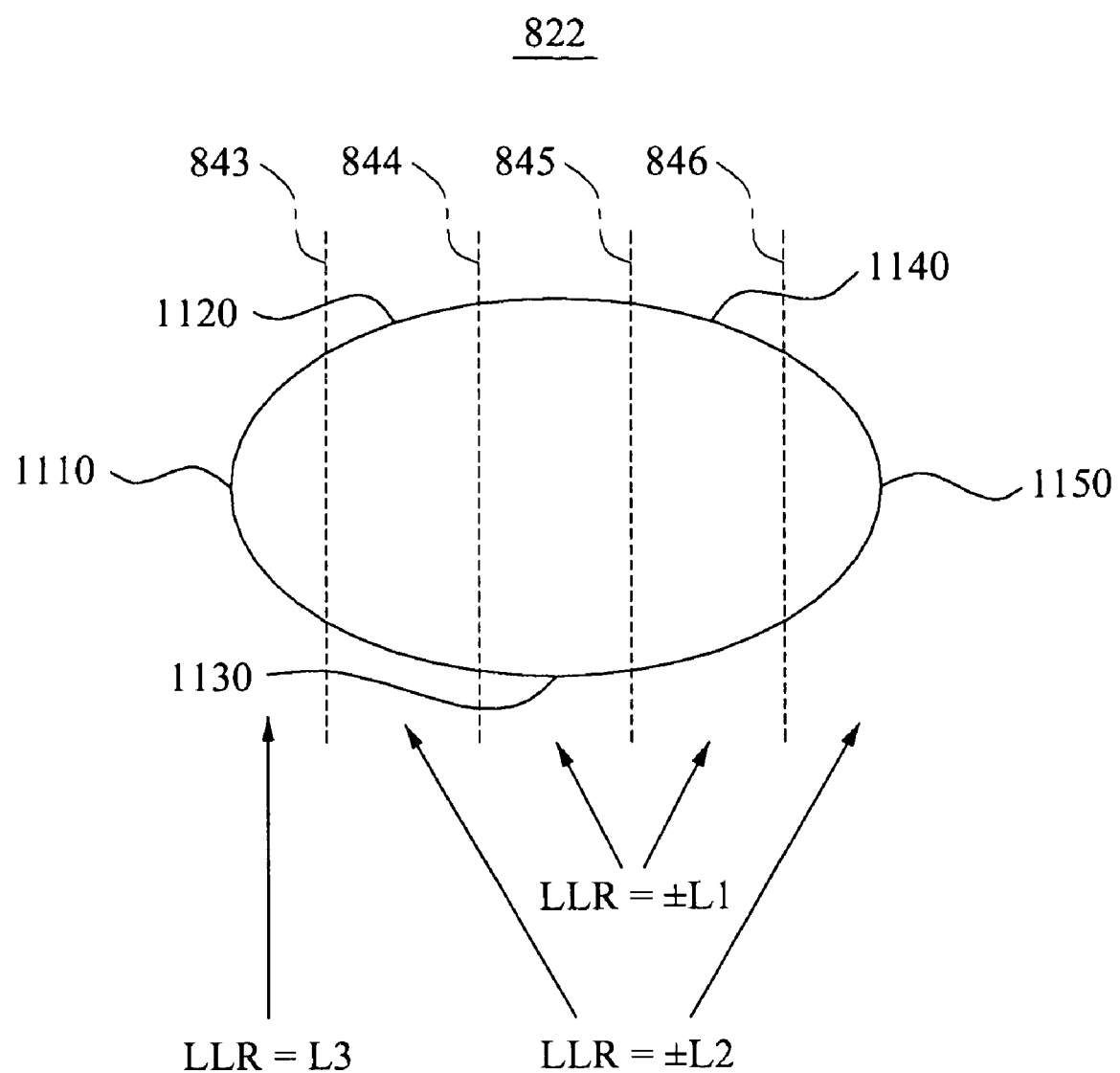

Referring to FIG. 11, the decision interval 822 includes a first decision interval 1110, a second decision interval 1120, a third decision interval 1130, a fourth decision interval 1140, and a fifth decision interval 1150.

The first decision interval 1110 is a decision interval corresponding to a threshold voltage less than the threshold voltage level 843. The second decision interval 1120 is a decision interval corresponding to a threshold voltage greater than the threshold voltage level 843 and less than the threshold voltage level 844. The third decision interval 1130 is a decision interval corresponding to a threshold voltage greater than the threshold voltage level 844 and less than the threshold voltage level 845. The fourth decision interval 1140 is a decision interval corresponding to a threshold voltage greater than the threshold voltage level 845 and less than the threshold voltage level 846. The fifth decision interval 1150 is a decision interval corresponding to a threshold voltage greater than the threshold voltage level 846.

The decision unit 120 may assign an LLR value to the decision intervals 1110, 1120, 1130, 1140, and 1150 according to a range of the third and fourth distributions 833 and 834 and an overlapped ratio between the third and fourth distributions 833 and 834. The decision unit 120 may assign a L3 value to the first decision interval 1110, a +L2 value to the second decision interval 1120, a +L1 value to the third decision interval 1130, a −L1 value to the fourth decision interval, and a −L2 value to a fifth decision interval 1150, respectively. Alternatively, according to example embodiments, the decision unit 120 may assign the L3 to the first decision interval 1110, the −L2 value to the second decision interval 1120, the −L1 value to the third decision interval 1130, the +L1 value to the fourth decision interval 1140, and the +L2 value to the fifth decision interval 1150, respectively.

A LSB of a multi-bit cell having a threshold voltage positioned in the third decision interval 1130 or the fourth decision interval 1140 may have a significantly high probability of being '1' and a significantly high probability of being '0', and thereby the LLR value (+L1 or −L1) assigned to the third decision interval 1130 or the fourth decision interval 1140 may approach '0'.

A LSB of a multi-bit cell having a threshold voltage positioned in the second decision interval 1120 may have a significantly higher probability of being '0' and a relatively lower probability of being '1', and thereby a magnitude (L2) of the LLR value assigned to the second decision interval 1120 may be greater than L1.

A LSB of a multi-bit cell having a threshold voltage positioned in the first decision interval 1110 may have a significantly low probability of being '1', and thereby a magnitude of the LLR value (|L3|) may be greater than a magnitude of L2 (|L2|).

Referring again to FIG. 1, the decision unit 120 may select the first number based on the time elapsed since the first data is stored in memory cells corresponding to the first channel, and also select the second number based on the time elapsed since the second data is stored in memory cells corresponding to the second channel.

Characteristics of the first or second channel may deteriorate according to the time elapsed since data was stored in the memory cells.

According to example embodiments, the decision unit 120 may select the first number based on an erase cycle of memory cells corresponding to the first channel, and also select the second number based on an erase cycle of memory cells corresponding to the second channel. Characteristics of the first channel or the second channel may deteriorate along with an increase in the erase cycle of the memory cells. In order to store new data in a nonvolatile memory such as a flash memory and the like, previous data must generally first be erased. In this instance, data retention characteristics of a memory cell may deteriorate along with an increase in program and erase cycles of the memory cell. A tendency that the data retention characteristics may deteriorate along with an increase in the program and erase cycles of the memory cell may designate endurance characteristics of the memory cell.

Figure 12:
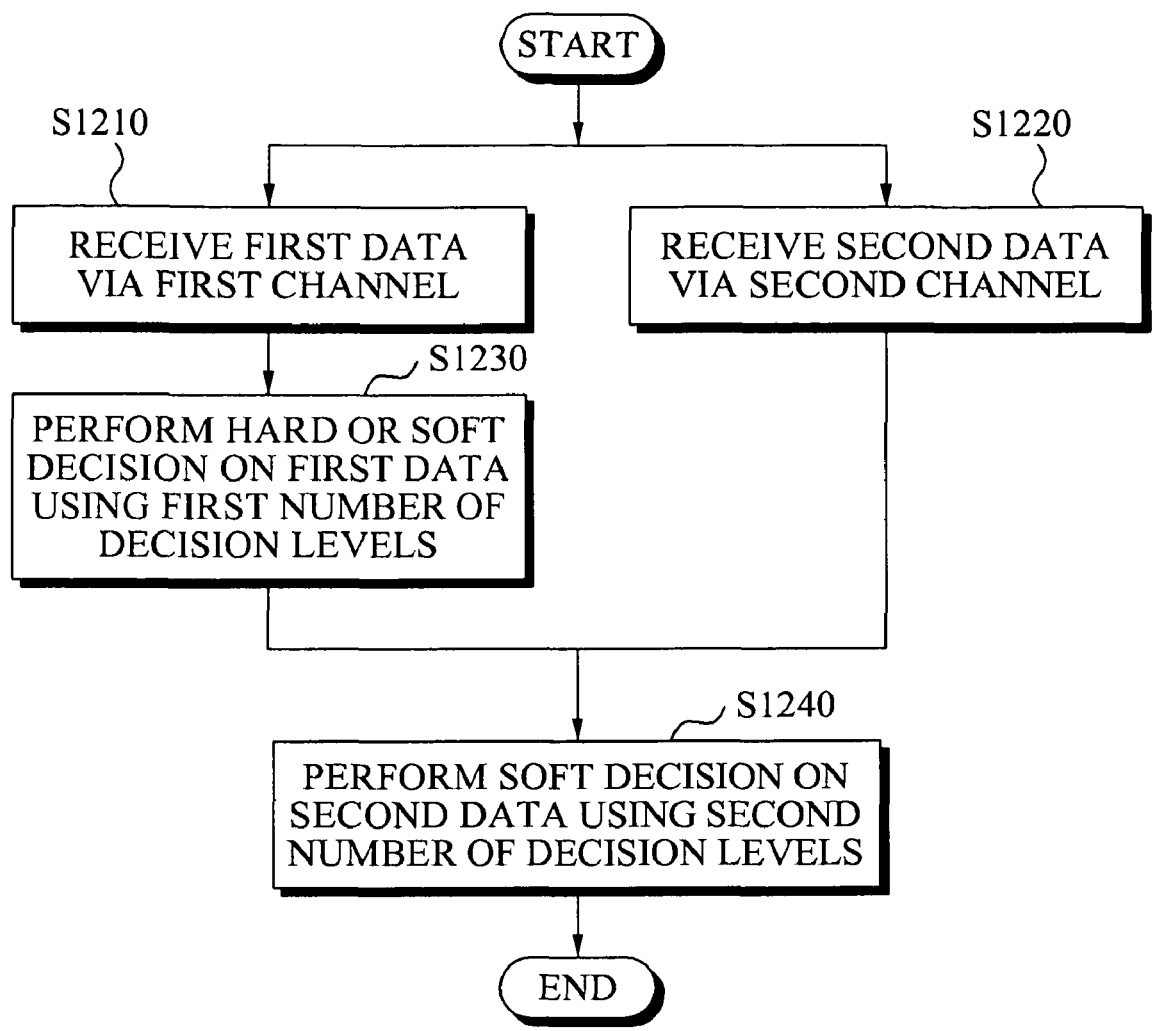
FIG. 12 is a flowchart illustrating a data decision method according to example embodiments.

FIG. 12 is a flowchart illustrating a data decision method according to example embodiments.

Referring to FIG. 12, in operation S1210, the data decision method receives first data via a first channel.

In operation S1220, the data decision method receives second data via a second channel.

In operation S1230, the data decision method performs a hard or soft decision on the first data using a first number of decision levels. In this instance, the first number of decision levels may be set based on characteristics of the first channel.

In operation S1240, the data decision method performs a soft decision on the second data using a second number of decision levels. In this instance, the second number of decision levels may be set based on characteristics of the second channel.

In operation S1240, the data decision method may perform the soft decision on the second data using the hard or soft decision results of operation S1230. According to example embodiments, the hard or soft decision results of operation S1230 may be stored in a storage device such as a buffer memory, and then used for increasing the soft decision level of the second data to decide.

The characteristics of the first channel may be superior to or better than the characteristics of the second channel, and the first number may be less than the second number.

The data decision method may perform ECC decoding on the first data on which the hard or soft decision is performed, and also perform ECC decoding on the second data on which the soft decision is performed.

The first channel may be a path for reading the first data from a memory page including a plurality of multi-bit cells, and the second channel may be a path for reading the second data from the memory page. The first and second channels may be data corresponding to bit layers different from each other while being stored in an identical memory page.

The data decision method may assign a LLR to a soft decision interval of the first data based on a distribution of a threshold voltage of the plurality of multi-bit cells of the memory page and the characteristics of the first channel.

The data decision method may assign a LLR to a soft decision interval of the second data based on the distribution of the threshold voltage of the plurality of multi-bit cells of the memory page and the characteristics of the second channel.

A state of a memory channel may deteriorate as program and erase operations are repeated and as a time elapses since the data is stored. The data decision method may select the soft decision level based on a program and erase cycle and/or the time elapsed since the data is stored.

The data decision method may select the first number based on the erase cycle of the memory cells corresponding to the first channel, and also select the second number based on the erase cycle of the memory cells corresponding to the second channel.

The data decision method may select the first number based on the time elapsed since the first data is stored in the memory cells corresponding to the first channel, and also select the second number based on the time elapsed since the second data is stored in the memory cells corresponding to the second channel.

The data decision method according to the above-described example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a main controller, and a flash memory device. The flash memory device may store N-bit data via the main controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The main controller and the flash memory device may constitute a solid state drive/disk (SSD) that uses a non-volatile memory to maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a main controller, and a flash memory device. The flash memory device may store N-bit data via the main controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The main controller and the flash memory device may constitute a solid state drive/disk (SSD) that uses a non-volatile memory to store data.

The foregoing descriptions of example embodiments have been presented for purposes of illustration and description. They are not intended to be exhaustive or to limit example embodiments to the precise forms disclosed, and obviously many modifications and variations are possible in light of the above teaching. Therefore, it is intended that the scope of example embodiments be defined by the claims appended thereto and their equivalents.

Although only some example embodiments have been shown and described, example embodiments are not limited to the described examples. Instead, it would be appreciated by those skilled in the art that changes may be made to these example embodiments without departing from the principles and spirit of example embodiments, the scope of which is defined by the claims and their equivalents.

What is claimed is:

1. A memory device, comprising:
   a memory cell array; and
   a decision unit configured to read first data from the memory cell array via a first channel, perform at least one of a hard and soft decision on the first data using a first number of decision levels set based on characteristics of the first channel, read second data from the memory cell array via a second channel, and perform a soft decision on the second data using a second number of decision levels set based on characteristics of the second channel.

2. The memory device of claim 1, wherein the memory cell array includes a plurality of multi-bit cells capable of storing multi-bit data, and the decision unit reads the second data from the multi-bit cells where the first data is read.

3. The memory device of claim 2, wherein the decision unit performs a soft decision on the second data using results obtained by performing at least one of the hard and soft decision on the first data.

4. The memory device of claim 2, wherein, the decision unit performs a soft decision on the first data using a metric value assigned to a soft decision interval of the first data based on at least one of the characteristics of the first channel and distribution of a threshold voltage of the multi-bit cells where the first data is read, and performs a soft decision on the second data using a metric value assigned to a soft decision interval of the second data based on at least one of the characteristics of the second channel and the distribution of the threshold voltage of the multi-bit cells where the first data is read.

5. The memory device of claim 4, wherein the metric value is one of a likelihood ratio (LR) and a log likelihood ratio (LLR).

6. The memory device of claim 1, wherein the first number is associated with a number of read voltage levels for reading the first data, and the second number is associated with a number of read voltage levels for reading the second data.

7. The memory device of claim 1, wherein the characteristics of the first channel are better than the characteristics of the second channel, and the first number is less than the second number.

8. The memory device of claim 1, further comprising:
   a decoder configured to perform Error Control Codes or Error Correction Codes (ECC) decoding on the first data on which at least one of the hard and soft decision is performed, and perform the ECC decoding on the second data on which the soft decision is performed.

9. The memory device of claim 1, wherein the decision unit selects the first number based on the time elapsed since the first data is stored in memory cells corresponding to the first channel, and selects the second number based on the time elapsed since the second data is stored in memory cells corresponding to the second channel.

10. The memory device of claim 1, wherein the decision unit selects the first number based on an erase cycle of memory cells corresponding to the first channel, and selects the second number based on an erase cycle of memory cells corresponding to the second channel.

11. A data decision method, comprising:
   receiving first data via a first channel;
   performing at least one of a hard and soft decision on the first data using a first number of decision levels set based on characteristics of the first channel;
   receiving second data via a second channel; and
   performing a soft decision the second data using a second number of decision levels set based on characteristics of the second channel.

12. The data decision method of claim 11, wherein the first channel is a path for reading the first data from a memory page including a plurality of multi-bit cells, and the second channel is a path for reading the second data from the memory page.

13. The data decision method of claim 12, wherein the performing of the soft decision on the second data performs the soft decision on the second data using results obtained by performing at least one of the hard and soft decision on the first data.

14. The data decision method of claim 12, further comprising: assigning a metric value to a soft decision interval of the first data based on at least one of the characteristics of the first channel and distribution of a threshold voltage of the plurality of multi-bit cells of the memory page; and assigning a metric value to a soft decision interval of the second data based on at least one of the characteristics of the second channel and the distribution of the threshold voltage of the plurality of multi-bit cells of the memory page.

15. The data decision method of claim 14, wherein the metric value is one of a likelihood ratio (LR) and a log likelihood ratio (LLR).

16. The data decision method of claim 11, wherein the characteristics of the first channel are better than the characteristics of the second channel, and the first number is less than the second number.

17. The data decision method of claim 11, further comprising:
performing a Error Control Codes or Error Correction Codes (ECC) decoding on the first data on which at least one of the hard and soft decision is performed, and
performing an ECC decoding on the second data on which the soft decision is performed.

18. The data decision method of claim 11, further comprising:
selecting the first number based on time elapsed since the first data is stored in memory cells corresponding to the first channel; and
selecting the second number based on time elapsed since the second data is stored in memory cells corresponding to the second channel.

19. The data decision method of claim 11, further comprising:
selecting the first number based on an erase cycle of memory cells corresponding to the first channel; and
selecting the second number based on an erase cycle of memory cells corresponding to the second channel.

20. A computer-readable recording medium encoded with a computer program for implementing the method of claim 11.

* * * * *